United States Patent [19]

Foote

[11] 4,251,317

[45] Feb. 17, 1981

[54] METHOD OF PREVENTING ETCH MASKING DURING WAFER ETCHING

[75] Inventor: Louis L. Foote, Mountain View, Calif.

[73] Assignee: Fairchild Camera and Instrument Corporation, Mountain View, Calif.

[21] Appl. No.: 34,824

[22] Filed: Apr. 30, 1979

[51] Int. Cl.³ .................................................. H01L 21/306
[52] U.S. Cl. .................................... 156/639; 156/345; 156/662
[58] Field of Search ............... 156/637, 639, 646, 662, 156/345; 134/25 A, 31, 32, 33, 34, 85, 86, 137, 138, 157-159

[56] References Cited

U.S. PATENT DOCUMENTS

| | | | |
|---|---|---|---|
| 3,745,079 | 7/1973 | Cowles | 156/637 X |
| 3,799,177 | 3/1974 | Thomas | 156/345 X |
| 3,977,926 | 8/1976 | Johnson et al. | 156/345 |

OTHER PUBLICATIONS

IBM Technical Disclosure Bulletin, vol. 19, No. 4, Sep. 1976, Bubble Burst Etching by G. L. Hutchins, pp. 1455-1456.

Primary Examiner—William A. Powell
Attorney, Agent, or Firm—Paul J. Winters; Theodore S. Park; Ronald J. Meetin

[57] ABSTRACT

As a cassette holding wafers in an etchant bath is rotated, nitrogen gas is bubbled through the cassette adjacent the wafers to agitate the wafers, so as to ensure that etchant reaches all edge portions of the wafers.

1 Claim, 3 Drawing Figures

METHOD OF PREVENTING ETCH MASKING DURING WAFER ETCHING

BACKGROUND OF THE INVENTION

This invention relates to semiconductor apparatus and, more particularly, to a method of etching semiconductor wafers.

In general, in etching thin, flat semiconductor wafers in order to remove any damaged portions thereof due to sawing and/or lapping a plurality of such wafers is positioned in a cassette, the cassette in turn being mounted on a rotatable support structure submerged in an etchant bath. The support structure and cassette provide appropriate open portions to allow etchant therethrough and into contact with the wafers. The individual wafers are supported adjacent respective edge portions thereof in the cassette, it being therefore understood that portions of the cassette are in quite close proximity to such edge portions. In prior systems, it has been found that even though the cassette and wafers are rotated in the etchant bath, etchant access to and flow around such edge portions is somewhat limited. Thus, it will readily be seen that an uneven etch may sometimes occur. This will clearly be seen to be undesirable, since such etching of semiconductor wafers must be very closely controlled.

SUMMARY OF THE INVENTION

It is accordingly an object of this invention to provide a method of etching wafers supported adjacent respective edge portions thereof in a cassette submerged in an etchant bath, wherein it is ensured that even etching of the wafers takes place.

It is a further object of this invention to provide a method which, while fulfilling the above object, is highly effective in use and simple in operation.

Broadly stated, the method of etching wafers supported adjacent respective edge portions thereof in a cassette comprises submerging the cassette and wafers supported thereby in an etchant bath, the cassette having open portions through which etchant can reach the wafers. The method further comprises rotating the cassette and wafers supported thereby in an etchant bath, and causing agitation of the wafers relative to the cassette while rotating the cassette to ensure that etchant reaches the edge portions of the wafers.

BRIEF DESCRIPTION OF THE DRAWINGS

These and other objects of the invention will become apparent from a study of the following specifications and drawings, in which.

DESCRIPTION OF THE PREFERRED EMBODIMENT

Figure 1:
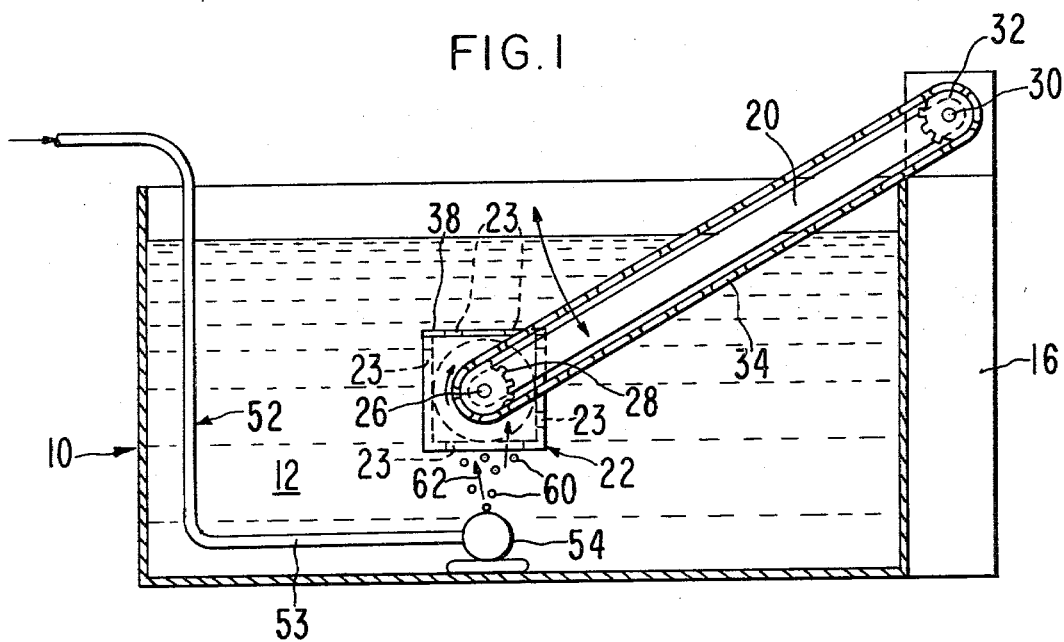
FIG. 1 is a side elevation of apparatus for practicing the present method.

Shown in FIG. 1 is a tank 10 which contains liquid etchant 12 in the form of an acid bath. The tank 10 has secured to one end thereof upwardly extending braces 14, 16, and arms 18, 20 are mounted respectively thereto and extend therefrom as shown. A support structure in the form of a housing 22 is rotatably mounted to the arms 18, 20 by means of shafts 24, 26. The shaft 26 has mounted thereto a sprocket 28, and a shaft 30 also is rotatably mounted to the braces 14, 16 and has a sprocket 32 fixed thereto. A drive chain 34 interconnects the sprockets 28, 32, and the shaft 30 may be rotated by means of a motor 36.

The arms 18, 20 may be raised and lowered (FIG. 1) to gain access to the housing 22 as required.

The housing 22 is sized and configured so that upon removal of a removable member 38 thereof, a cassette 40 having wafers 42 supported therewithin may be positioned within the housing, and may be held therein by attachment of member 38. As noted in FIG. 3, for example, the edge portion 43 of a wafer 42 fits between two protruding portions 44 defined by the cassette 40, so that that wafer 42 is supported by the cassette 40 adjacent the respective edge portions of the wafer 42. The housing 22 and cassette 40 have appropriate openings 23, 41 therein so that etchant 12 may reach the wafers 42 when the housing 22 and cassette 40 are submerged in the etchant 12. As will readily be seen, etchant 12 may freely reach the central portions 45 of the wafers 42, but flow is somewhat restricted in the areas of the wafers 42 adjacent the protrusions 44. In light of this, a pair of tubes 50, 52 extends into the etchant 12 and lead to adjacent the base of the tank 10. These tubes 50, 56 communicate with a manifold 54 running transversely of the portions 51, 53 of the tubes adjacent the bottom of the tank 10, the longitudinal axis of the manifold 54 being substantially parallel to and directly below the axis of rotation of the housing 22, as defined by the shafts 24, 26. The manifold 54 defines a plurality of evenly-spaced openings 58 along the upper surface thereof.

Figure 2:
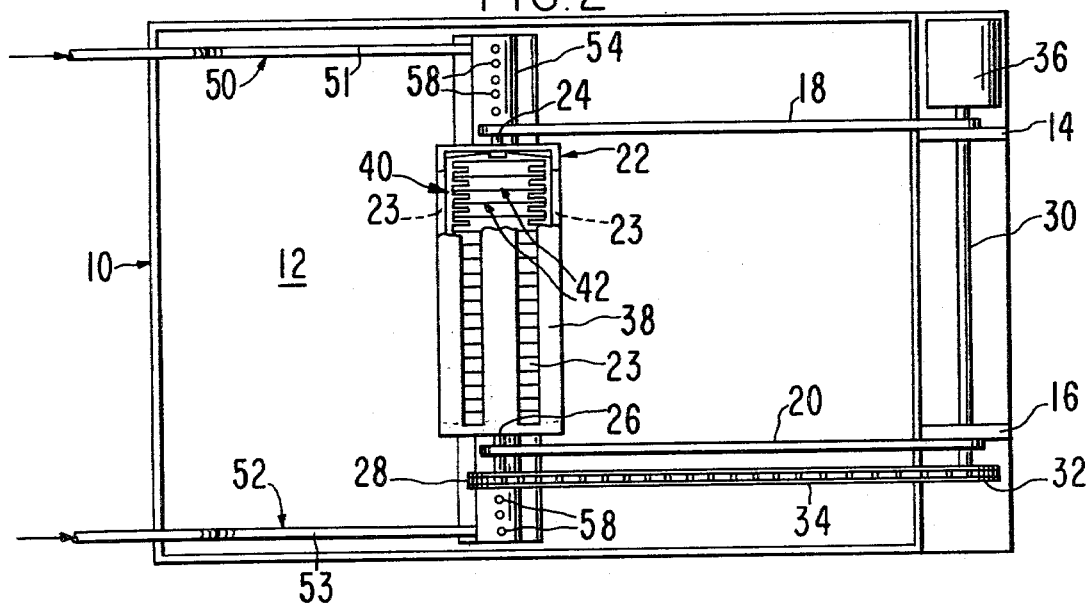
FIG. 2 is a plan view of the apparatus shown in FIG. 1.
Figure 3:
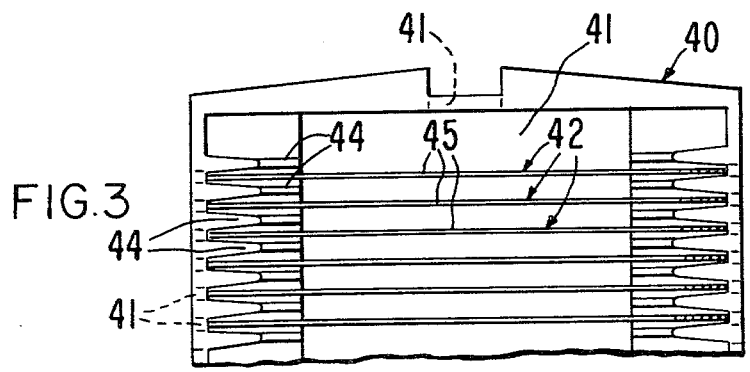
FIG. 3 is an enlarged plan view of a portion of the cassette of the apparatus, showing wafers mounted therein.

In the operation of the apparatus, with the arms 18, 20 positioned as shown in FIGS. 1 and 2, the motor 36 is operated to rotate the cassette 40 and wafers 42 therein in the etchant bath 12. Meanwhile, nitrogen gas 60 is supplied through the tubes 50, 52 and into both ends of the manifold 54. It will be seen that nitrogen gas 60 will bubble from the manifold 54 along its length in and through the etchant 12, beneath the wafers 42, so that the bubbles 60 will pass upward adjacent the cassette 40 and wafers 42 as generally shown by the arrows 62 of FIG. 1. As will be seen, the gas bubbles 60 travel in a direction generally perpendicular to the axis of rotation of the cassette 40. As the cassette 40 is continuously rotated, the gas bubbles 60 are also provided continuously. Such provision of gas bubbles 60 causes agitation of the wafers 42 relative to the cassette 40. This will provide a certain lateral motion of the wafers 42 relative to the cassette 40 (i.e., up and down as shown in FIGS. 2 and 3), to ensure that etchant 12 reaches the edge portions of the wafers 42 disposed between the protrusions 44.

It will readily be seen that a highly efficient and effective method of etching semiconductor wafers is herein disclosed.

I claim:

1. A method of etching wafers supported adjacent respective edge portions thereof in a cassette, comprising:

submerging the cassette and wafers supported thereby in an etchant bath, the cassette having longitudinal open portions through which etchant can reach the wafers;

continuously rotating the cassette and wafers supported thereby in said etchant both; and causing agitation of the wafers by providing gas bubbles in the etchant longitudinally beneath the cassette so that the bubbles travel in a direction perpendicular to the axis of rotation through the longitudinal open portions whereby the wafers will be agitated relative to the cassette to aid etchant reaching the edge portions of the wafers.

* * * * *